United States Patent
Leobandung (10) Patent No.: US 9,570,449 B2
(45) Date of Patent: Feb. 14, 2017

(54) METAL STRAP FOR DRAM/FINFET COMBINATION

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/591,065

(22) Filed: Jan. 7, 2015

(65) Prior Publication Data

US 2016/0197083 A1 Jul. 7, 2016

(51) Int. Cl.
*H01L 27/108* (2006.01)
*H01L 27/12* (2006.01)
*H01L 29/94* (2006.01)

(52) U.S. Cl.
CPC ... *H01L 27/10867* (2013.01); *H01L 27/10826* (2013.01); *H01L 27/10829* (2013.01); *H01L 27/10879* (2013.01); *H01L 27/1211* (2013.01); *H01L 29/945* (2013.01)

(58) Field of Classification Search
CPC .............. H01L 27/10826; H01L 27/10867
See application file for complete search history.

(56) References Cited

U.S. PATENT DOCUMENTS

| 7,132,333 | B2 | 11/2006 | Schloesser et al. |
| 7,456,471 | B2 | 11/2008 | Anderson et al. |
| 8,030,707 | B2 | 10/2011 | Cheng et al. |
| 8,421,139 | B2 | 4/2013 | Kanakasabapathy et al. |
| 8,673,729 | B1 | 3/2014 | Basker et al. |
| 2004/0150037 | A1* | 8/2004 | Katsumata ............ H01L 29/945 257/330 |
| 2007/0063244 | A1* | 3/2007 | Ho .......................... H01L 21/84 257/301 |
| 2009/0096003 | A1 | 4/2009 | Zhu |
| 2013/0049089 | A1 | 2/2013 | Baars et al. |
| 2013/0092992 | A1 | 4/2013 | Chang et al. |
| 2014/0030864 | A1 | 1/2014 | Basker et al. |
| 2014/0374878 | A1* | 12/2014 | Leobandung ........... H01L 28/40 257/532 |

OTHER PUBLICATIONS

Katsumata et al., "Fin-Array-FET on bulk silicon for sub-100 nm Trench Capacitor DRAM", 2003 Symposium on VLSI Technology Digest of Technical Papers, pp. 61-62.

* cited by examiner

*Primary Examiner* — Marc Armand
*Assistant Examiner* — Sarah Salerno
(74) *Attorney, Agent, or Firm* — Stephen R. Yoder (57) ABSTRACT

A metal strap is formed in a middle-of-line (MOL) process for communication between an eDRAM and a FinFET. An oxide is deposited in a trench over the eDRAM to prevent development of an epitaxial film prior to formation of the metal strap. The result is an epiless eDRAM strap in a FinFET.

9 Claims, 7 Drawing Sheets

METAL STRAP FOR DRAM/FINFET COMBINATION

FIELD OF THE INVENTION

This disclosure relates generally to memory in semiconductor devices and, more specifically, to a structure for a combined FinFET and DRAM device.

BACKGROUND OF THE INVENTION

The fabrication of semiconductor devices involves forming electronic components in and on semiconductor substrates, such as silicon wafers. These electronic components may include one or more conductive layers, one or more insulation layers, and doped regions formed by implanting various dopants into portions of a semiconductor substrate to achieve specific electrical properties. Semiconductor devices include transistors, resistors, capacitors, and the like, with intermediate and overlying metallization patterns at varying levels, separated by dielectric materials, which interconnect the semiconductor devices to form integrated circuits.

A complementary metal oxide semiconductor device (CMOS) uses symmetrically-oriented pairs of p-type and n-type metal oxide semiconductor field effect transistors (MOSFETs) arranged on substrate, such as bulk silicon or silicon or silicon-on-insulator (SOI) substrates. Source and drain regions associated with the MOSFET are connected by a channel. A gate disposed over the channel controls the flow of current between the source and drain regions. The channel may be defined by a thin "fin" that provides more than one surface through which the gate controls the flow of current, thereby making the MOSFET a "FinFET" device.

Dynamic random access memory (DRAM) employs memory cells having a FinFET (or other type of transistor) and a storage capacitor arranged in series. Embedded DRAM (eDRAM) embeds these memory cells into the same semiconducting material that contains a microprocessor, which allows for wider buses and faster operating speeds (as compared to DRAM) in an integrated circuit (IC) chip. Many of these embedded memory cells comprising FinFETs and storage capacitors can be arranged on a single chip or within a single package to define an array. Operation of the memory cells is controlled by various circuits, many of which are structurally different from each other, and warrant different manufacturing techniques.

SUMMARY

One aspect of an embodiment of the present invention discloses a method that comprises providing a semiconductor substrate having a storage capacitor formed in a deep trench. The method further comprises depositing a dielectric layer into a recess adjacent to a conductive region of the storage capacitor. The method further comprises forming a fin of a transistor, including a portion of the dielectric layer deposited into the recess. The method further comprises etching an opening through the dielectric layer over the conductive region. Subsequently, the method comprises depositing a metal layer into the opening and onto the conductive region.

Another aspect of an embodiment of the present invention discloses an electrical structure. The electrical structure comprises a storage capacitor formed in a deep trench of a semiconductor substrate; a transistor formed on the semiconductor substrate; a fin of a transistor, formed with an adjacent oxide deposit; an epitaxial film grown on the fin of the transistor; a metal strap deposited in an opening, the metal strap connecting the transistor to the storage capacitor; and the adjacent oxide deposit is located above, and in contact with, a conductive region of the storage capacitor.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

A metal strap is formed in a middle-of-line (MOL) process for communication between a trench capacitor of an eDRAM and a FinFET. An oxide is deposited in a trench over the eDRAM capacitor to prevent development of an epitaxial film prior to formation of the metal strap. The result is an epiless eDRAM strap in a FinFET.

In exemplary embodiments of the present invention, an eDRAM metal strap connection structure for a FinFET provides communication between a storage capacitor and a first end of a fin of the FinFET. The storage capacitor is located in a deep trench formed in a substrate, and the fin is formed on a surface of the substrate. As is known by those of skill in the art, a deep trench is one in which the depth from an upper edge of the trench to a bottom of the trench is about 1-5 micrometers (μm). The eDRAM metal strap connection structure allows for electrical connection of the fin to the storage capacitor in the deep trench.

Some embodiments of the present invention recognize the following facts, potential problems, and/or potential areas for improvement with respect to the current state of the art: (i) combining the FinFET technology with an eDRAM is a desirable, yet difficult to practice, technology; (ii) conventional approaches that use polysilicon strap technology for communication suffer from high resistance; (iii) trench topology tends to cause bad polysilicon profile; (iv) conventional practices result in epitaxial film present within the deep trench (DT) causing shorts to occur; and/or (v) conventionally, the top oxide layer, sometimes referred to as the trench top oxide (TTO), introduces concerns of oxide thickness and/or buried oxide (BOX) layer corrosion.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on", "positioned on" or "positioned atop" mean that a first element, such as a first structure, is present on a second element, such as a second structure, wherein intervening elements, such as an interface structure may be present between the first element and the second element. The term "direct contact" means that a first element and a second element are connected without any intermediary conducting, insulating or semiconductor layers at the interface of the two elements.

Figure 1A:
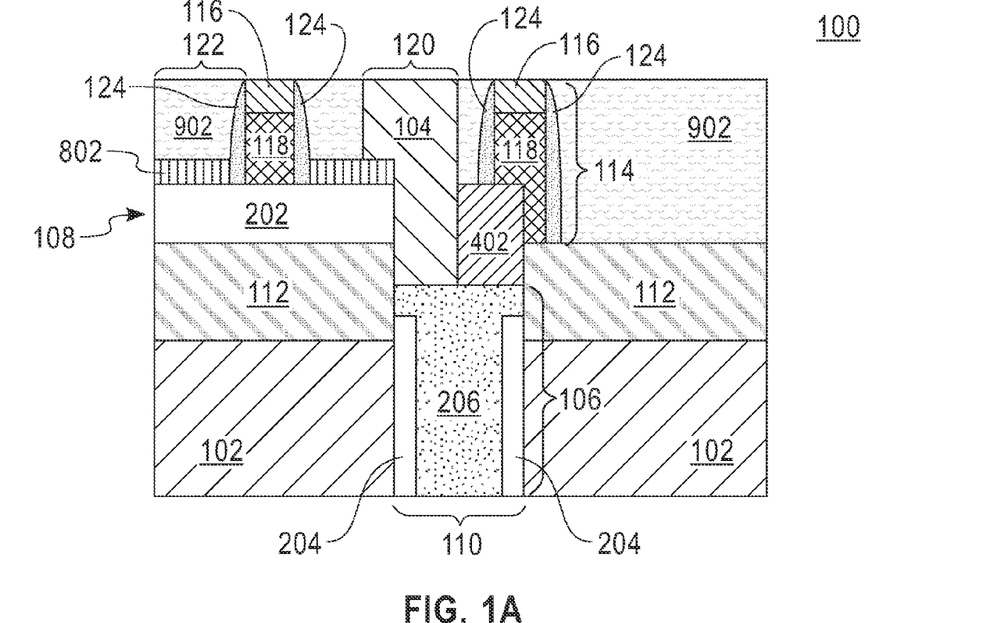
FIG. 1A is a side cross-sectional view of a semiconductor device, according to the present invention.
Figure 1B:
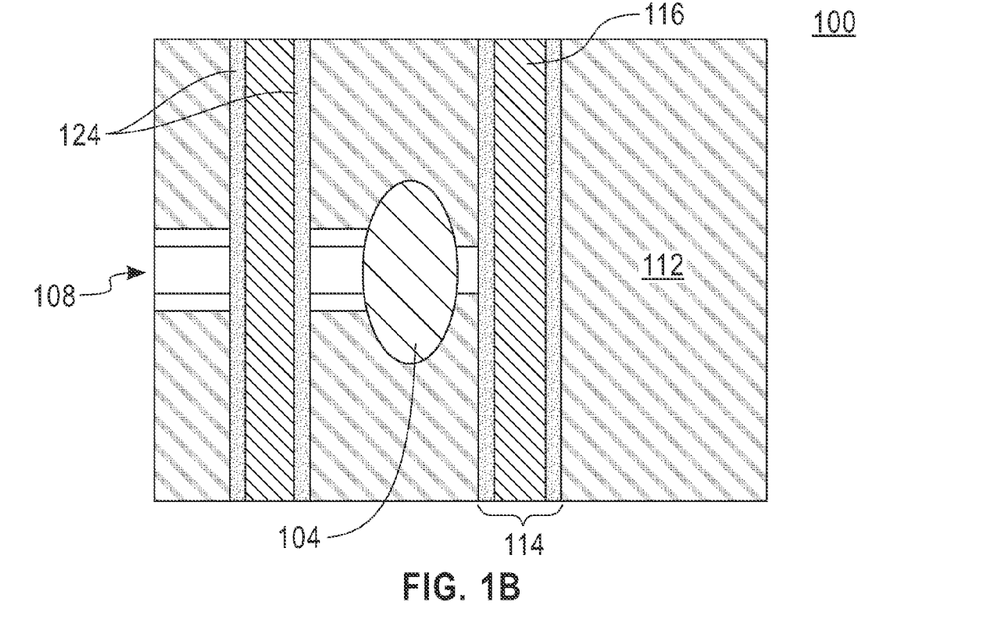
FIG. 1B is a top view of the device of FIG. 1A.

FIGS. 1A and 1B depict the top view and cross-sectional view of an exemplary semiconductor device where metal strap 104 is used in a low-resistance eDRAM strap FinFET. FinFET 100 includes semiconductor substrate 102. Semiconductor substrate 102 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. Semiconductor substrate 102 may also be composed of other semiconductor materials, such as germanium and compound semiconductor substrates, such as type III/V semiconductor substrates, e.g., GaAs. Although semiconductor substrate 102 is depicted as a bulk semiconductor substrate, semiconductor on insulator (SOI) substrate arrangements, such as silicon on insulator substrates, are also suitable for semiconductor substrate 102.

In this embodiment, metal strap 104 is a low resistance metal deposited after FinFET device processing, such that it does not see the epitaxy process of the FinFET device. The metal strap provides communication between storage capacitor 106 and fin 108 of finFET 100. The storage capacitor is disposed in a deep trench 110 formed in buried oxide (BOX) layer 112, as well as in any underlying bulk substrate material of substrate 102. The fin is formed from a silicon-on-insulator (SOI) material at an upper surface of substrate 102. Communication between the storage capacitor and the fin is effected through the metal strap.

FinFET 100 has three terminals, i.e., gate stack 114, source region 120, and drain region 122. Gate stack 114 is a structure used to control output current, i.e., flow of carriers in a channel, below gate stack 114 through electrical or magnetic fields. The channel is the region between source region 120 and drain region 122 that becomes conductive when FinFET 100 is turned on. Source region 120, is a doped region in the transistor from which majority carriers are flowing into the channel. Drain region 122 is a doped region in the transistor located at the end of the channel in which carriers are flowing into from source region 120 via the channel and out of FinFET 100. In an alternative embodiment, source region 120 and drain region 122 may be "raised" source/drain regions, wherein a portion of the respective source/drain region is formed through epitaxial growth of semiconductor material embedded in semiconductor substrate 102. The respective source/drain regions can then rise out of semiconductor substrate 102, while another portion of the respective source/drain regions resides within semiconductor substrate 102.

Gate stack 114 includes at least a gate dielectric 116 atop a gate conductor 118. Gate conductor 118 may be a metal gate electrode. Gate conductor 118 may be composed of any conductive metal including, but not limited to, W, Ni, Ti, TiN, Mo, Ta, Cu, Pt, Ag, Au, Ru, Ir, Rh, and Re, and alloys that include at least one of the aforementioned conductive elemental metals. In another embodiment, gate conductor 118 may also be composed of a doped semiconductor material, such as n-type doped polysilicon.

Although not depicted in FIG. 1, gate conductor 118 may be a multi-layered structure. For example, gate conductor 118 may include a second conductive material atop a metal gate electrode. In one example, the second conductive material may be a doped semiconductor material, such as a doped silicon containing material, e.g., n-type doped polysilicon. When a combination of conductive elements is employed, an optional diffusion barrier material such as TaN or WN may be formed between the conductive materials.

Gate dielectric 116 of gate stack 114 is typically present on a gate conductor 118. Gate dielectric 116 may be a dielectric material, such as $SiO_2$, or alternatively a high-k dielectric, such as oxides of Hf, Ta, Zr, Al, or combinations thereof. In another embodiment, gate dielectric 116 is comprised of an oxide, such as $ZrO_2$, $Ta_2O_5$, or $Al_2O_3$. In one embodiment, gate dielectric 116 has a thickness ranging from 1 nm to 10 nm. In another embodiment, the gate dielectric 116 has a thickness ranging from 1.0 nm to 2.0 nm.

Spacer 124 is in direct contact with the sidewalls of gate stack 114. The spacer typically has a width ranging from 2.0 nm to 15.0 nm, as measured from the sidewall of gate stack 114. The spacer is generally composed of a dielectric, such as a nitride, oxide, oxynitride, or a combination thereof.

Gate dielectric 116 and gate conductor 118 of gate stack 114 are present over the channel. Source region 120 and drain region 122 are on opposing sides of the channel. The conductivity-type of source region 120 and drain region 122 determines the conductivity of FinFET 100. Conductivity-type denotes whether source region 120 and drain region 122 have been doped with a p-type or n-type dopant. N-type dopant in a silicon containing material includes type V elements from the Periodic Table of Elements, such as phosphorus and arsenic. P-type dopant in a silicon containing material includes type III elements from the Periodic Table of Elements, such as boron.

Each of source region 120 and drain region 122 may include an extension dopant region (not shown) and a deep dopant region. The deep dopant region is usually formed either through implantation or epitaxial growth, wherein the source and drain regions are doped in situ during formation.

Although only one semiconductor device (FinFET 100) is shown on substrate 102, any number of semiconductor devices may be formed on substrate 102 in various embodiments. Where multiple devices exist, device regions are preferably separated via dielectric trench isolation (not shown). This prevents electrical current leakage between adjacent semiconductor device components. In various embodiments, isolation regions may be at varying depths to form embodiments of shallow trench isolation or deep trench isolation.

Figure 2:
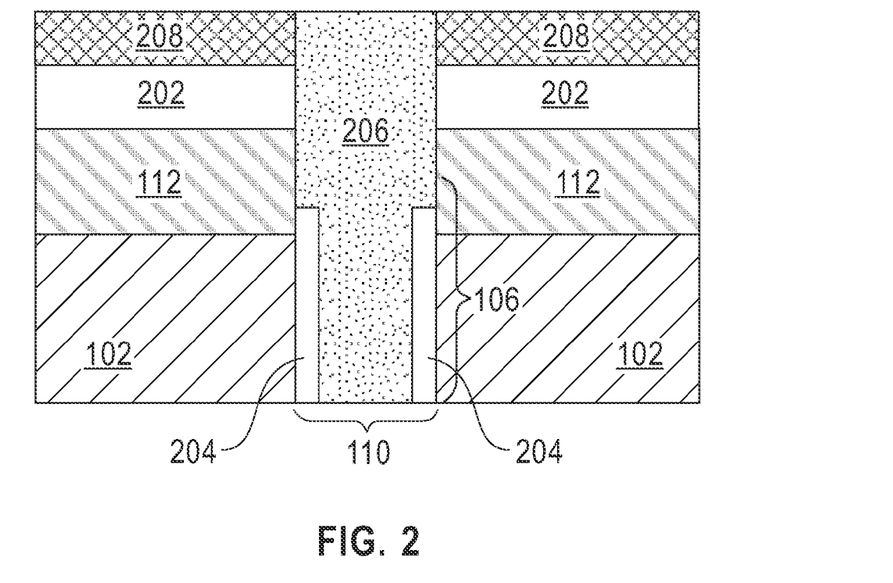
FIG. 2 is a side cross-sectional view of one exemplary step in the forming of the semiconductor device of FIG. 1A.

FIGS. 2-9 depict one exemplary method of fabricating FinFET 100, according to an embodiment of the present invention. Referring now to FIG. 2, the semiconductor substrate 102 is provided as the bulk substrate material into which oxygen ions are implanted to form BOX layer 112 of silicon dioxide ($SiO_2$) that defines SOI layer 202 at the surface of substrate 102. Alternatively, BOX layer 112 and SOI layer 202 are formed using a conventional deposition process such as, for example, chemical vapor deposition (CVD), plasma-enhanced chemical vapor deposition (PECVD), chemical solution deposition, sputtering, atomic layer deposition (ALD), physical vapor deposition (PVP), spin-on coating, epitaxial growth and other like deposition processing. Nitride layer 208 is located above the SOI layer. Deep trench 110 is formed in the substrate using any suitable method, such as etching.

Continuing with FIG. 2, storage capacitor 106 is formed in deep trench 110. In forming the storage capacitor, a film of high k dielectric material, referred to as dielectric film 204, is first deposited on at least the sidewalls of the opening forming the deep trench. The dielectric film may comprise one or more of the following materials: (i) hafnium silicate; (ii) zirconium silicate; (iii) hafnium dioxide; and/or (iv) zirconium dioxide. Deposition of the dielectric film may be by chemical vapor deposition or atomic layer deposition. After deposition of the dielectric film, the deep trench is filled with conductor 206, to form storage capacitor 106. The conductor may be a poly conductor, such as polysilicon, or a metal.

Figure 3:
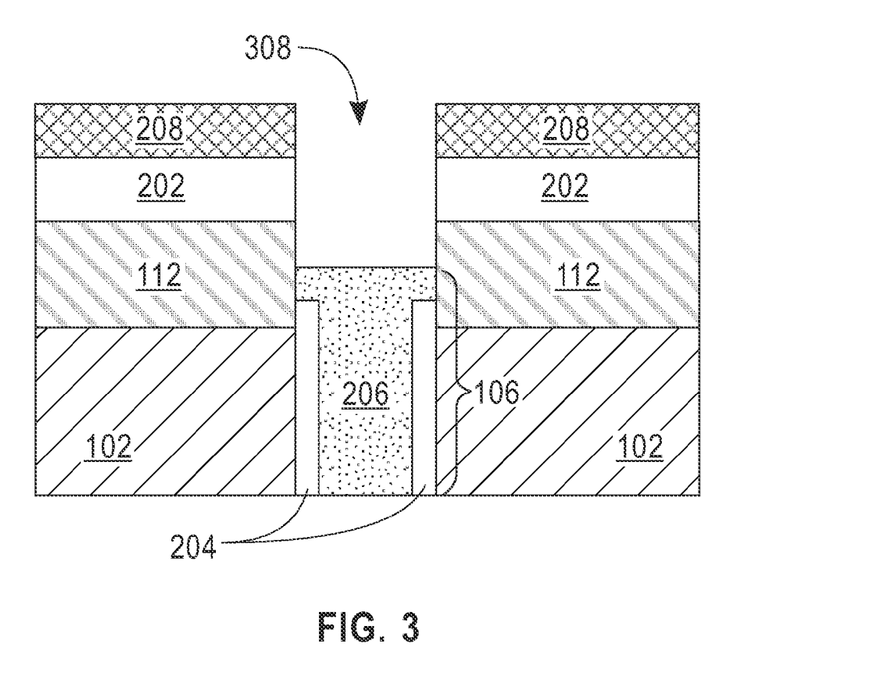
FIG. 3 is a side cross-sectional view of another exemplary step in the forming of the semiconductor device of FIG. 1A.

Referring now to FIG. 3, recess 308 is formed according to an embodiment of the present invention. Any suitable anisotropic etching technique (e.g., dry etching) may be employed for form the recess. In one embodiment, the etching process is a timed etch process, to reach a specified depth.

Figure 4:
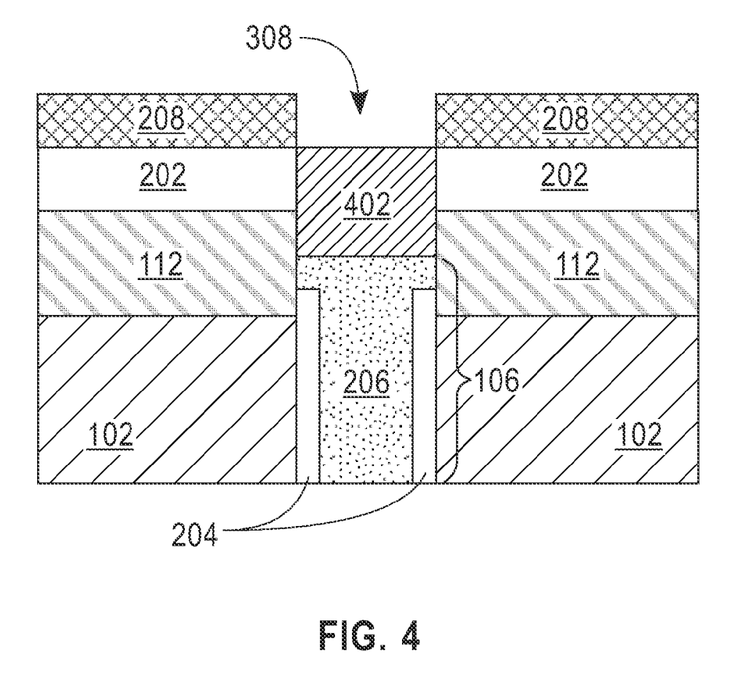
FIG. 4 is a side cross-sectional view of another exemplary step in the forming of the semiconductor device of FIG. 1A.

In FIG. 4, oxide layer 402, which may be referred to as TTO, is deposited in recess 308. The TTO deposition process may be accomplished, for example, with CVD (Chemical Vapor Deposition), plasma enhanced CVD, or other suitable method.

Figure 5:
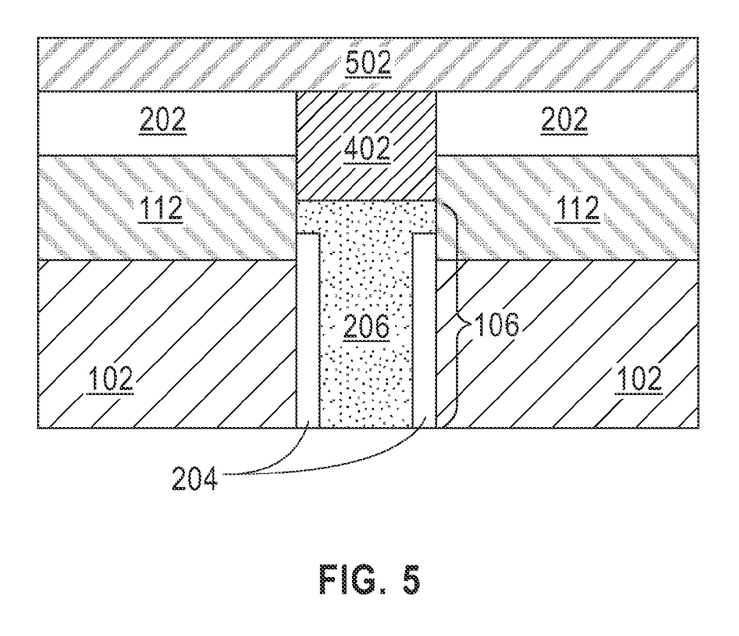
FIG. 5 is a side cross-sectional view of another exemplary step in the forming of the semiconductor device of FIG. 1A.

FIG. 5 depicts a state during fabrication of FinFET 100 when nitride layer 208 (see FIG. 4) is stripped and nitride layer 502 is deposited such that oxide layer 402, among other top surface regions, is covered by the nitride layer.

Figure 6A:
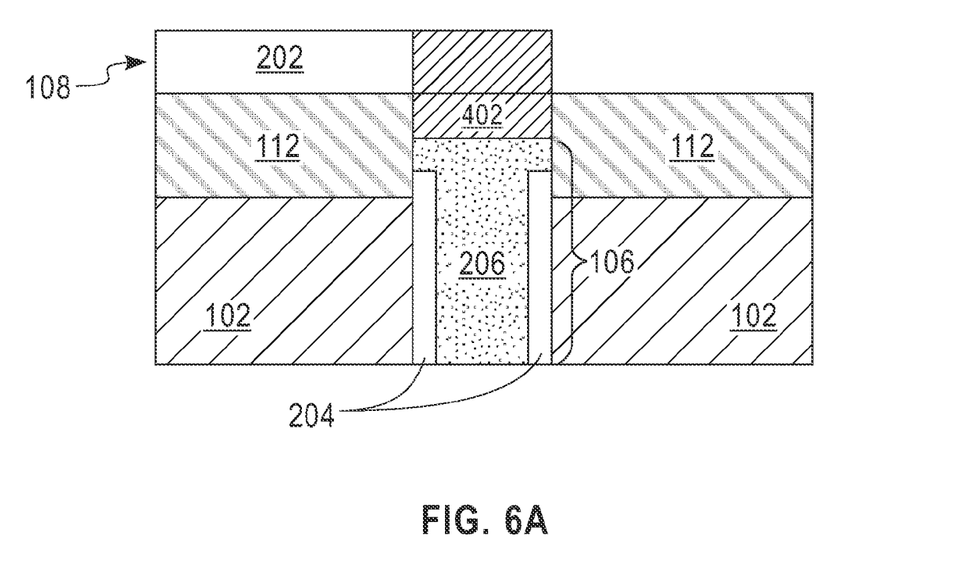
FIG. 6A is a side cross-sectional view of another exemplary step in the forming of the semiconductor device of FIG. 1A.
Figure 6B:
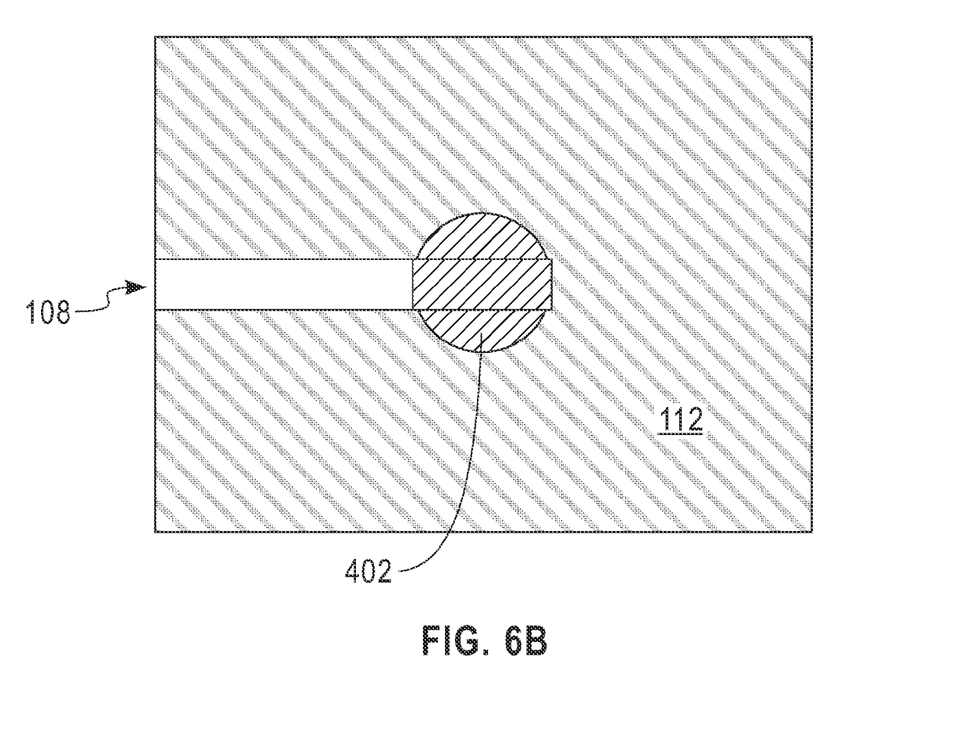
FIG. 6B is a top view of the exemplary step of FIG. 6A.

In FIGS. 6A and 6B, nitride layer 502 is removed and fin 108 is patterned and etched. FIG. 6B is the top view of the structure as-developed when the fin is patterned, before the gate(s) are formed. Typically, patterning is accomplished with oxide sidewall image transfer (SIT) process. Alternatively, other appropriate lithographic processes are employed to pattern fin 108.

When the nitride layer is removed during patterning, it should be noted that oxide layer 402 over conductor 206 is both self-aligned and thick. The self-aligned process is obtained from the fill and recess process of oxide layer 402. In that way, no separate mask operation is needed.

Figure 7:
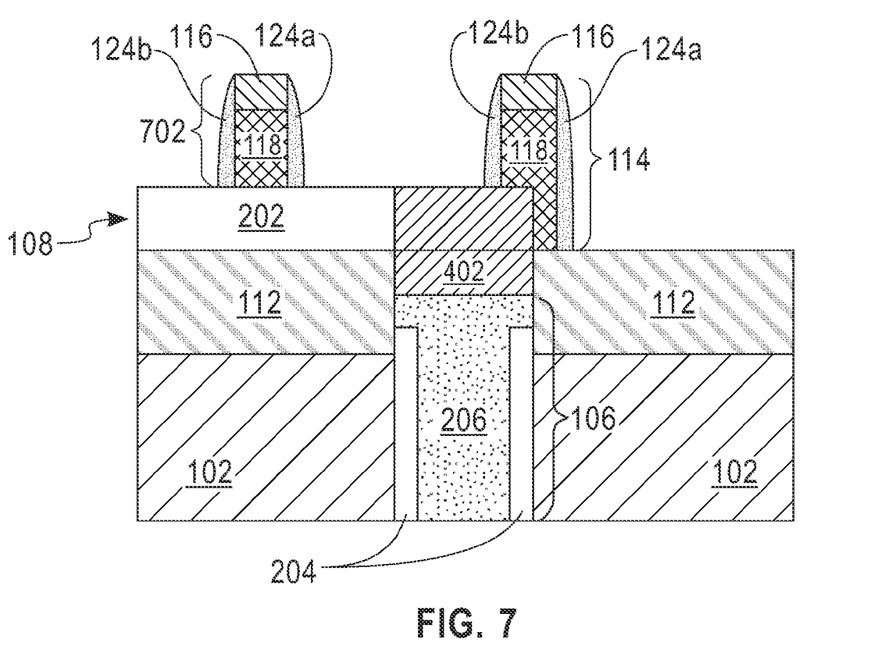
FIG. 7 is a side cross-sectional view of another exemplary step in the forming of the semiconductor device of FIG. 1A.

Referring now to FIG. 7, gate stack 114 is patterned and spacers 124a, 124b are formed. Additionally gate stack 702 is patterned in the illustrated state of manufacture. Note that there is no deep topography in a trench at this stage of manufacture. The trench extends only to BOX layer 112. In that way, the profile of fin 108 is easier to control than using conventional practices.

Figure 8:
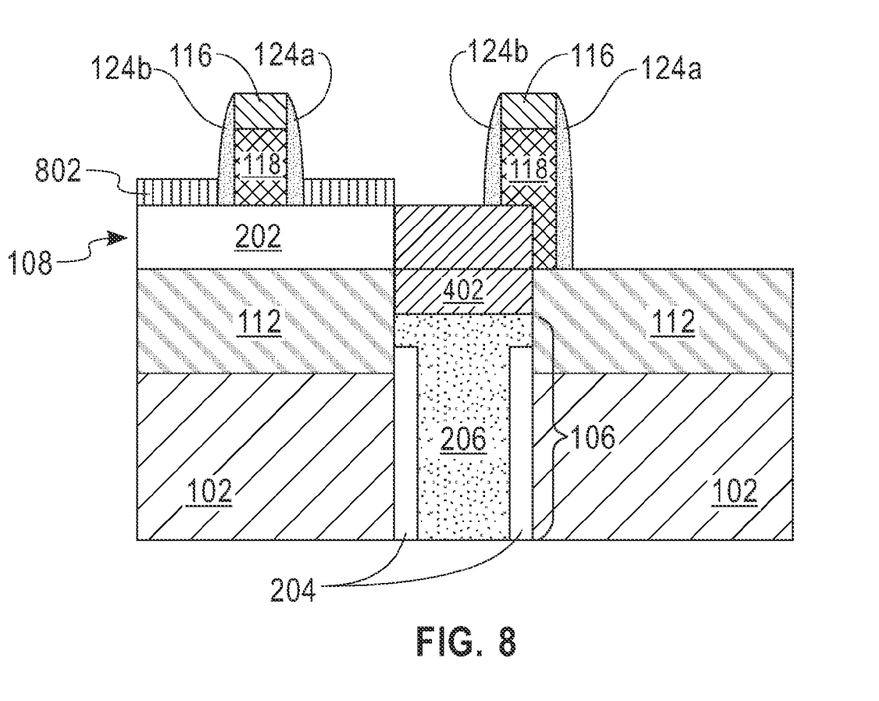
FIG. 8 is a side cross-sectional view of another exemplary step in the forming of the semiconductor device of FIG. 1A.

In FIG. 8, epitaxial layer 802 is developed for only fin 108, adding no epitaxial material at top oxide layer 402, or TTO. Selective epitaxial growth assures that the epitaxial layer is gown only on the fin. This process assures that no epitaxial film is deposited in the deep trench where capacitor 106 is located and where the metal strap will be deposited, as shown in FIG. 1.

Figure 9:
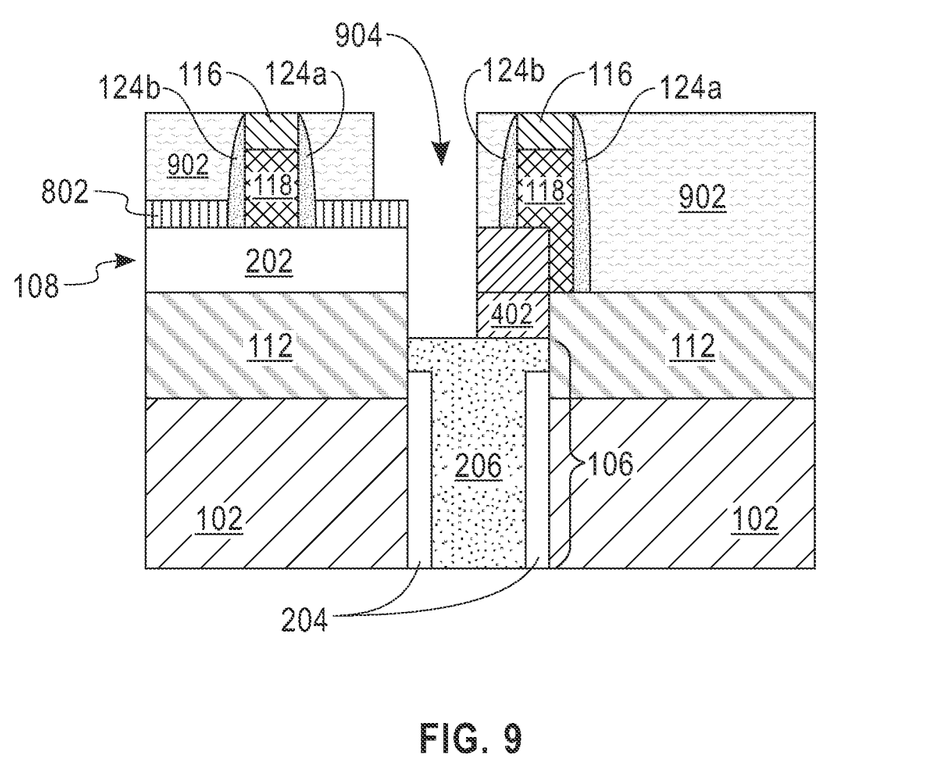
FIG. 9 is a side cross-sectional view of another exemplary step in the forming of the semiconductor device of FIG. 1A.

FIG. 9 illustrates the manufacturing stage just before the metal strap is deposited and FinFET 100 is complete. In FIG. 9, middle-of-line (MOL) wafer planarization occurs after deposition of oxide layer 902. The "gate last" approach is illustrated, following replacement metal gate (RMG) process flow.

Also shown in FIG. 9, after planarization, recess 904 is formed. Any suitable anisotropic etching technique (e.g., dry etching) may be employed to form the recess. The recess can be formed by patterning the hole using a standard photo lithography process. This recess can also be formed together with other contact to another FinFET device on the wafer; hence, no additional lithography steps are needed.

Any use of the terms "connected," "coupled," or variants thereof, should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical, or any suitable combination thereof, in accordance with the described exemplary embodiments. As non-limiting examples, the connection or coupling may comprise one or more printed electrical connections, wires, cables, mediums, or any suitable combination thereof.

Figure 10:
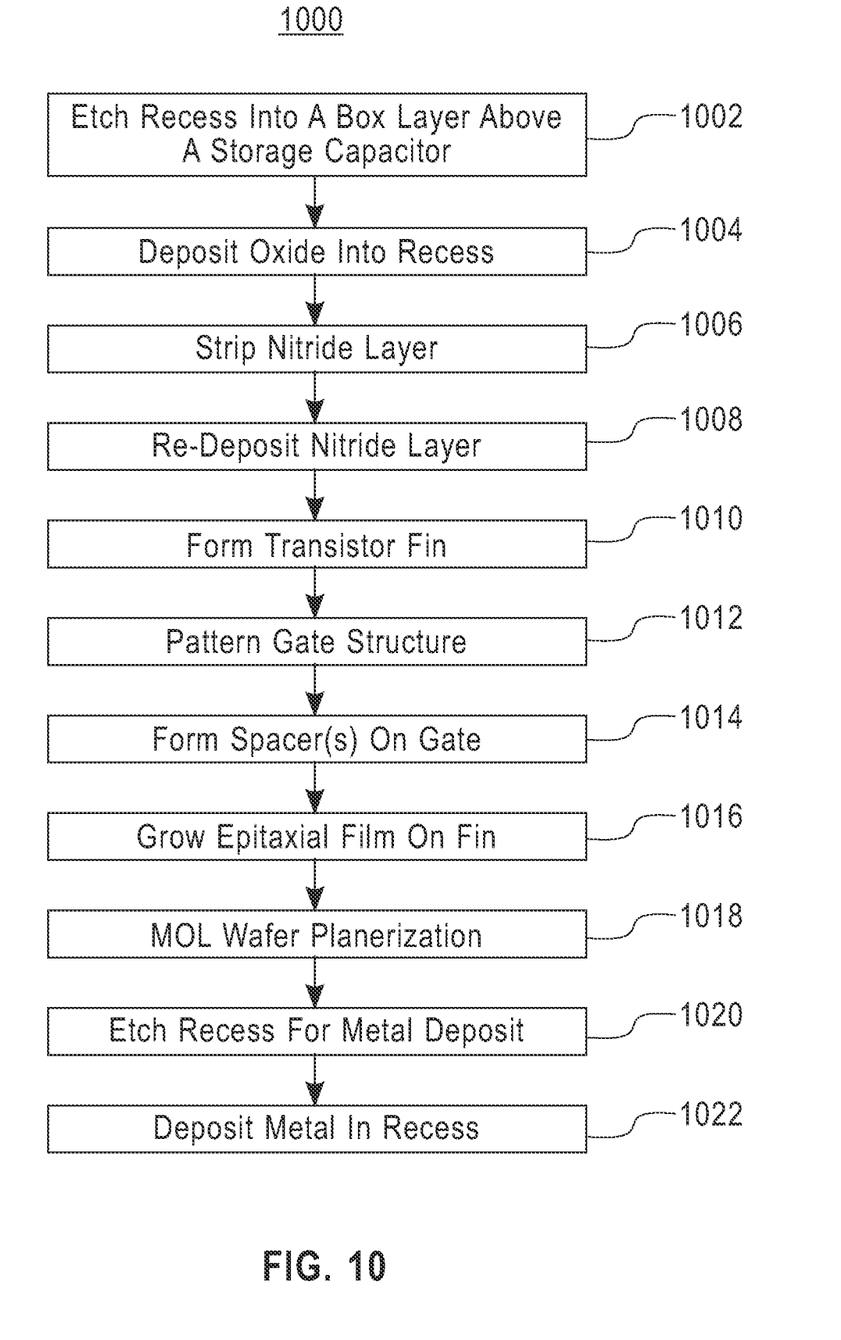
FIG. 10 is a flowchart of one embodiment of a process for making a semiconductor device according to the present invention.

FIG. 10 depicts the steps of a flowchart for process 1000 for forming a metal strap connection between a DRAM and a FinFET, according to an embodiment of the present invention.

FIG. 10 also depicts the steps for process 1000 of forming a metal strap connection between a FinFET and an embedded capacitor, such as an eDRAM. The first step in this exemplary process flow is to etch a recess through a silicon-on-insulator (SOI) substrate into a corresponding buried oxide (BOX) layer (step 1002). The recess exposes a conductor of the embedded capacitor, such as polysilicon, at a depth below the top surface of the substrate. In some embodiments, as illustrated in FIG. 3, the depth is at a level within the BOX layer. Subsequent to etching the recess, an oxide is deposited into the recess (step 1004). This oxide layer deposited into the recess may be referred to as the TTO layer. In subsequent steps, the oxide will self-align during fin formation in the SOI substrate. Subsequent processing includes: stripping a nitride layer from the SOI layer (step 1006); and (ii) re-depositing a nitride layer (step 1008) prior to step 1010, where a fin of a transistor is formed on the semiconductor substrate. Typically, this forming process is achieved with an oxide sidewall image transfer (SIT) process. It should be noted that in this step, the oxide layer deposited in step 1004 is self-aligned, such that no separate mask is needed. Subsequent to forming the fin, a gate structure is patterned to contact the fin (step 1012). In this patterning step, there is no deep topography in the trench, which only reaches the BOX, just like the fin. In that way, profiling the gate is easier to control, compared to conventional practices. Subsequent processing includes: (i) forming spacer(s) on the gate (step 1014); (ii) growing an epitaxial layer at the fin only, that is, no epitaxial film is placed in a trench or otherwise in contact with the storage capacitor (step 1016); and (iii) middle-of-line (MOL) wafer planarization (step 1018), where a replacement metal gate (RMG) process flow occurs. Subsequent to patterning the gate structure and the MOL planarization, a recess is etched through the oxide layer to the storage capacitor (step 1020). A low-resistance metal is deposited into the etched recess (step 1022), referred to a "metallization." The metallization step may occur at the same time as contact is made to a logic device.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Some embodiments of the present invention may include one or more of the following features, characteristics, and/or advantages: (i) a low resistance metal strap provides for improved communication over conventional polysilicon structures, where the metal strap is formed after FIN device processing at middle-of-line (MOL); (ii) conventional trench topography is eliminated; (iii) no epitaxial film in the deep trench; and/or (iv) the top oxide layer, or TTO, where the TTO completely covers the trench capacitor, is self-aligned when the fin is formed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a method for forming a liner free tungsten contact and the resulting structure (which are intended to be illustrative and not limiting), it is noted that modifications and variations may be made by persons skilled in the art in light of the above teachings. It is, therefore, to be understood that changes may be made in the particular embodiments disclosed which are within the scope of the invention as outlined by the appended claims.

What is claimed is:

1. A method comprising:
providing a semiconductor substrate having a storage capacitor formed in a deep trench, the storage capacitor comprising a dielectric film and a conductor;
depositing a dielectric layer into a recess adjacent to a conductive region of the storage capacitor;
forming a fin of a transistor, the fin including a portion of the dielectric layer deposited into the recess;
etching an opening through a portion of the dielectric layer, the opening etched to a depth that exposes an epitaxial layer of the fin and an end of the conductor of the storage capacitor; and
depositing a metal layer into the opening and on the end of the conductive region making electrical connection between the metal layer and the conductive region of the storage capacitor;
wherein:
an electrical communication path is established between the storage capacitor and the transistor.

2. The method of claim 1, further comprising:
etching the recess adjacent the conductive region of the storage capacitor;
wherein the step of etching the recess occurs prior to the step of depositing the dielectric layer.

3. The method of claim 1, further comprising:
patterning a gate on the semiconductor substrate;
wherein the step of patterning occurs after the step of forming the fin.

4. The method of claim 1, further comprising:
growing the epitaxial film only on the fin, such that no epitaxial film is on the conductive region;
wherein the step of growing the epitaxial film occurs prior to the step of etching an opening through the dielectric layer over the conductive region.

5. The method of claim 1, wherein the opening through the dielectric layer is a trench.

6. The method of claim 1, wherein the conductive region is the top surface of a conductor of the storage capacitor.

7. The method of claim 1, wherein the storage capacitor is an eDRAM device.

8. The method of claim 1, wherein the dielectric layer comprises an oxide.

9. The method of claim 1, wherein the metal layer comprises one of tungsten, titanium, copper, and aluminum.

* * * * *